(12) United States Patent  
Yamamoto

(10) Patent No.: US 7,363,015 B2
(45) Date of Patent: Apr. 22, 2008

(54) WIDE-FREQUENCY-RANGE TELEVISION TUNER

(75) Inventor: Masaki Yamamoto, Tokyo (JP)

(73) Assignee: Alps Electric Co., Ltd, Tokyo (JP)

( * ) Notice: Subject to any disclaimer, the term of this patent is extended or adjusted under 35 U.S.C. 154(b) by 478 days.

(21) Appl. No.: 11/157,579

(22) Filed: Jun. 21, 2005

(65) Prior Publication Data

US 2005/0287970 A1 Dec. 29, 2005

(30) Foreign Application Priority Data

Jun. 23, 2004 (JP) ............................. 2004-003660

(51) Int. Cl.
*H04B 7/00* (2006.01)
(52) U.S. Cl. ................ 455/260; 455/180.3; 455/191.2; 348/733; 330/279
(58) Field of Classification Search ............. 455/179.1, 455/180.1–180.4, 188.1, 191.1, 191.2, 192.1–192.3, 455/196, 197.2, 197.3, 255–260; 348/729, 348/731, 733, 737, 738; 330/253, 262–264, 330/277–279
See application file for complete search history.

(56) References Cited

U.S. PATENT DOCUMENTS

| | | | | |
|---|---|---|---|---|
| 6,392,715 B1 * | 5/2002 | Sato et al. | ................... | 348/731 |
| 6,795,128 B2 * | 9/2004 | Yamamoto | ................... | 348/729 |
| 6,925,291 B2 * | 8/2005 | Pugel | ....................... | 455/191.1 |
| 7,187,913 B1 * | 3/2007 | Rahn et al. | ............... | 455/188.1 |
| 7,274,410 B2 * | 9/2007 | Birleson et al. | ............. | 348/731 |
| 2002/0186326 A1 * | 12/2002 | Yamamoto | ................... | 348/731 |

FOREIGN PATENT DOCUMENTS

| | | |
|---|---|---|
| JP | 7-7387 | 1/1995 |
| JP | 11-275478 | 10/1999 |

* cited by examiner

*Primary Examiner*—Edward F. Urban
*Assistant Examiner*—Nhan T. Le
(74) *Attorney, Agent, or Firm*—Brinks Hofer Gilson & Lione

(57) ABSTRACT

A television tuner includes a tuning circuit having two first varactor diodes for changing a tuning frequency, a mixer for converting a television signal to an intermediate frequency signal, an oscillator having a second varactor diode, and a PLL circuit for outputting a tuning voltage for tuning the television signal. The tuning voltage is applied to cathodes of the first varactor diodes and the second varactor diode, and voltages of anodes of the first varactor diodes and the second varactor diode are higher at a time of receiving the television signal whose frequency is lower than or equal to a predetermined frequency than at a time of receiving a television signal whose frequency is higher than the predetermined frequency.

3 Claims, 3 Drawing Sheets

WIDE-FREQUENCY-RANGE TELEVISION TUNER

This application claims the benefit of priority to Japanese Patent Application No. 2004-003660 filed on Jun. 23, 2004, herein incorporated by reference.

BACKGROUND OF THE INVENTION

1. Field of the Invention

The present invention relates to a television tuner.

2. Description of the Related Art

A known television tuner will be described next with reference to FIG. 4. As shown in FIG. 4, an interstage double-tuned circuit 53 (hereinafter simply referred to as a "double-tuned circuit") is provided between a high-frequency amplifier 51 and a mixer 52. A primary tuning circuit 53a includes a high-band tuning coil 54, a low-band tuning coil 55 connected in series to one end of the high-band tuning coil 54, and a varactor diode 56 connected in parallel to these tuning coils 54 and 55. An anode of the varactor diode 56 is connected to ground. A cathode of the varactor diode 56 is connected to the other end of the high-band tuning coil 54 via a direct-current blocking capacitor 57.

A secondary tuning circuit 53b also includes a high-band tuning coil 58, a low-band tuning coil 59 connected in series to one end of the high-band tuning coil 58, and a varactor diode 60 connected in parallel to these tuning coils 59 and 60. An anode of the varactor diode 60 is connected to ground. A cathode of the varactor diode 60 is connected to the other end of the high-band tuning coil 58 via a direct-current blocking capacitor 61.

The low-band tuning coils 55 and 59 are connected to one end of a coupling coil 62. The other end of the coupling coil 62 is connected to ground via a direct-current blocking capacitor 63.

A connection point between the high-band tuning coil 54 and the low-band tuning coil 55 is connected to a cathode of a switching diode 64. An anode of the switching diode 64 is connected to ground via a direct-current blocking capacitor 65. Similarly, a connection point between the high-band tuning coil 58 and the low-band tuning coil 59 is connected to a cathode of a switching diode 66. An anode of the switching diode 66 is connected to ground via a direct-current blocking capacitor 67.

The anode of the switching diode 64 is connected to a high-band switching terminal 69 via a resistor 68. Similarly, the anode of the switching diode 66 is connected to the high-band switching terminal 69 via a resistor 70.

Additionally, a connection point between the coupling coil 62 and the direct-current blocking capacitor 63 is connected to a low-band switching terminal 72 via a resistor 71. Furthermore, a tuning voltage is applied to the cathode of the varactor diode 56 from a tuning voltage terminal 73 via a resistor 74. Similarly, the tuning voltage is also applied to the cathode of the varactor diode 60 from the tuning voltage terminal 73 via a resistor 75.

A peaking circuit 76 is provided between the double-tuned circuit 53 and the mixer 52. A direct-current blocking capacitor 77 blocks a direct current flowing into the peaking circuit 76 from the double-tuned circuit 53. Also, a direct-current blocking capacitor 78 blocks a direct current flowing into the peaking circuit 76 from the mixer 52.

The peaking circuit 76 includes a peaking coil 79, a switching diode 80, and a direct-current blocking capacitor 81, all of which are connected in series. A cathode of the switching diode 80 is connected to the low-band switching terminal 72 via a resistor 82. An anode of the switching diode 80 is connected to the high-band switching terminal 69 via a resistor 83. The inductance of the peaking coil 79 and an input capacitance 84 of the mixer 52 together resonate with the low range frequency of a television signal in a high-band television signal.

In such a structure, when receiving a high-band VHF television signal, both switching diodes 64 and 66 conduct by applying a switching voltage to the high-band switching terminal 69 so that the double-tuned circuit 53 receives a high-band television signal. Since the switching voltage applied to the high-band switching terminal 69 is also applied to the anode of the switching diode 80, the switching diode 80 also conducts. Accordingly, a parallel resonant circuit is formed by the peaking coil 79 and the input capacitance 84 of the mixer 52.

The parallel resonant circuit formed by the peaking coil 79 and the input capacitance 84 of the mixer 52 increases the gain in the low range of the high-band television signal. Additionally, a tuning voltage applied to the tuning voltage terminal 73 causes the double-tuned circuit 53 to be tuned to a desired frequency.

When receiving a low-band VHF television signal, both switching diodes 64 and 66 do not conduct by applying a switching voltage to the low-band switching terminal 72 so that the double-tuned circuit 53 receives the low-band television signal. Since the switching voltage applied to the low-band switching terminal 72 is also applied to the cathode of the switching diode 80, the switching diode 80 also does not conduct. Accordingly, the peaking circuit 76 is disabled (refer to, for example, Japanese Unexamined Patent Application Publication No. 11-275478, in particular, FIG. 2).

As described above, known television tuners increase the received frequency range by providing a switching diode in a tuning circuit in order to switch bands, and therefore, the structure of the tuning circuit becomes complicated. To increase the received frequency range using a tuning circuit without band switching, the tuning voltage must be significantly lowered. However, since the tuning voltage is output from a PLL (phase-locked loop) circuit, the low tuning voltage is not stable, which is a problem.

SUMMARY OF THE INVENTION

Accordingly, it is an object of the present invention to provide a television tuner for receiving wide-frequency-range television signals by using a tuning voltage output from a PLL circuit down to the minimum value without band switching by a switching diode.

According to the present invention, a television tuner includes a tuning circuit for tuning a television signal. The tuning circuit includes a first varactor diode for changing a tuning frequency. The television tuner further includes a mixer for converting a television signal output from the tuning circuit to an intermediate frequency signal, an oscillator for supplying a local oscillating signal to the mixer, and a PLL circuit for outputting a tuning voltage for tuning the television signal. The oscillator includes a second varactor diode for changing an oscillating frequency. In the television tuner, the tuning voltage is applied to cathodes of the first varactor diode and the second varactor diode, and voltages of anodes of the first varactor diode and the second varactor diode are higher at a time of receiving the television signal whose frequency is lower than or equal to a predetermined frequency than at a time of receiving a television signal whose frequency is higher than the predetermined frequency.

According to the present invention, the television tuner further includes a transistor for switching voltages of the anodes of the first varactor diode and the second varactor diode. In the television tuner, a collector of the transistor is pulled up to a predetermined voltage, an emitter of the transistor is connected to ground, the anodes of the first varactor diode and the second varactor diode are connected to the collector of the transistor by the corresponding first resistors, the anodes of the first varactor diode and the second varactor diode are also connected to ground for a direct current by the corresponding second resistors, the transistor is turned on when receiving the television signal whose frequency is higher than the predetermined frequency, and the transistor is turned off when receiving the television signal whose frequency is lower than or equal to the predetermined frequency.

Preferably, the tuning voltage is applied to a base of the transistor.

Preferably, the predetermined voltage is a stabilized voltage.

According to the first aspect of the present invention, a television tuner includes a tuning circuit for tuning a television signal. The tuning circuit includes a first varactor diode for changing a tuning frequency. The television tuner further includes a mixer for converting a television signal output from the tuning circuit to an intermediate frequency signal, an oscillator for supplying a local oscillating signal to the mixer, and a PLL circuit for outputting a tuning voltage for tuning the television signal. The oscillator includes a second varactor diode for changing an oscillating frequency. In the television tuner, the tuning voltage is applied to cathodes of the first varactor diode and the second varactor diode, and voltages of anodes of the first varactor diode and the second varactor diode are higher at a time of receiving the television signal whose frequency is lower than or equal to a predetermined frequency than at a time of receiving a television signal whose frequency is higher than the predetermined frequency. Consequently, the tuning voltage can be increased when receiving a television signal having a frequency less than or equal to the predetermined frequency. As a result, the range of received frequencies can be expanded without using an unstable, low tuning voltage.

According to a second aspect of the present invention, the television tuner further includes a transistor for switching voltages of the anodes of the first varactor diode and the second varactor diode. In the television tuner, a collector of the transistor is pulled up to a predetermined voltage, an emitter of the transistor is connected to ground, the anodes of the first varactor diode and the second varactor diode are connected to the collector of the transistor by the corresponding first resistors, the anodes of the first varactor diode and the second varactor diode are also connected to ground for a direct current by the corresponding second resistors, the transistor is turned on when receiving the television signal whose frequency is higher than the predetermined frequency, and the transistor is turned off when receiving the television signal whose frequency is lower than or equal to the predetermined frequency. Consequently, the voltage of the anode of the varactor diode can be increased when receiving the television signal whose frequency is lower than or equal to the predetermined frequency.

According to a third aspect of the present invention, since the tuning voltage is applied to a base of the transistor, the tuning voltage can automatically increase the voltage of an anode of the varactor diode.

According to a fourth aspect of the present invention, since the predetermined voltage is a stabilized voltage, both tuning frequency and oscillating frequency are also stabilized.

DESCRIPTION OF THE PREFERRED EMBODIMENTS

Figure 1:
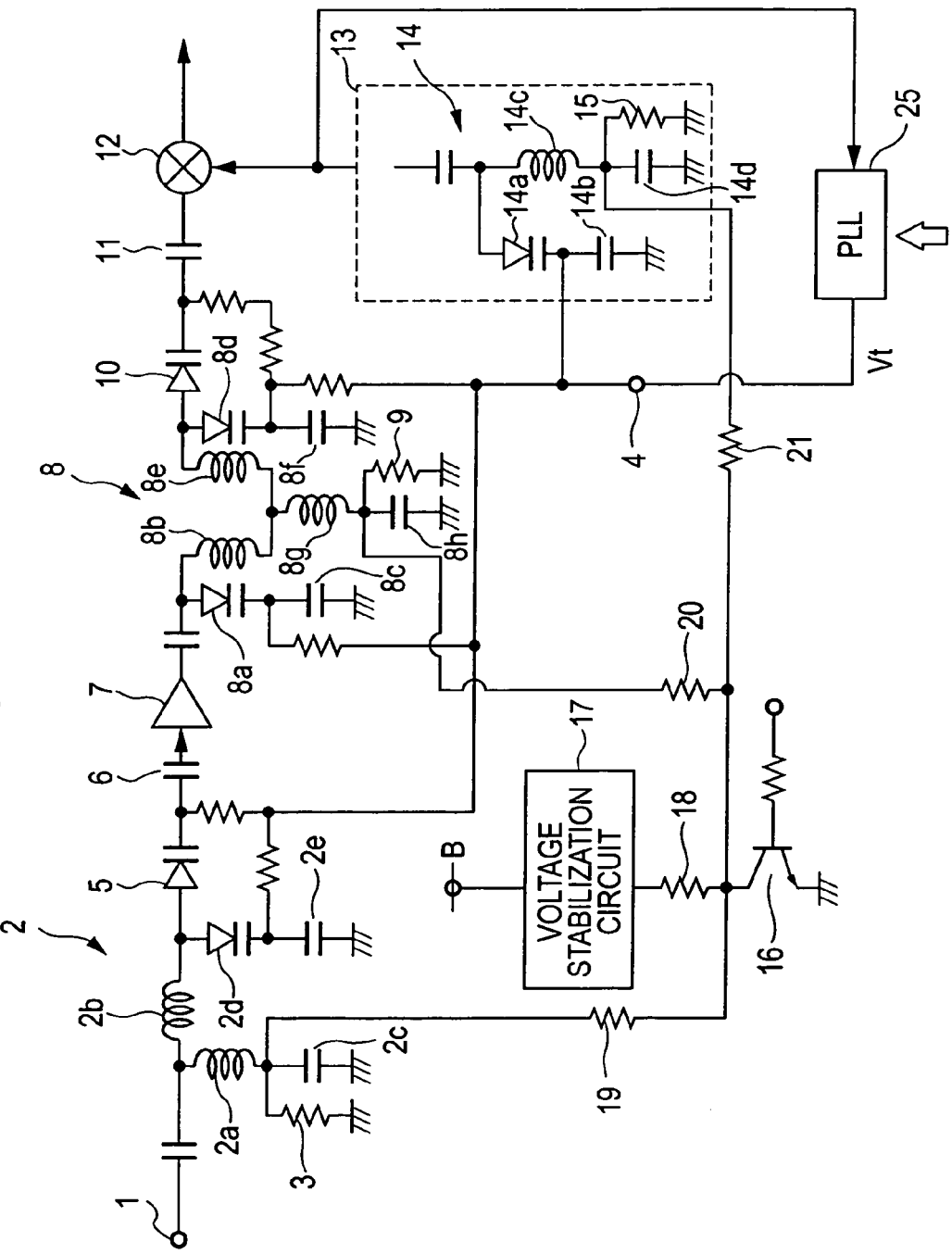
FIG. 1 is a circuit diagram of a television tuner according to an embodiment of the present invention.

FIG. 1 is a circuit diagram of a television tuner according to an embodiment of the present invention. For example, an input terminal 1 receives television signals in a VHF broadcast band according to the standard in the United States (the low band covers the frequency range of 55.25 MHz to 83.25 MHz and the high band covers the frequency range of 175.25 MHz to 211.25 MHz).

An input tuning circuit 2 is connected to the input terminal 1. The input tuning circuit 2 is a tuning circuit that does not carry out band switching. The input tuning circuit 2 includes an inductance element 2a, an inductance element 2b connected in series to the inductance element 2a, a capacitor 2c which connects an end of the inductance element 2a to ground, a first varactor diode 2d whose anode is connected to the inductance element 2b, and a capacitor 2e which connects a cathode of the first varactor diode 2d to ground. A connection point between the inductance element 2a and the capacitor 2c is connected to ground via a second resistor 3. The cathode of the first varactor diode 2d is also connected to a tuning voltage terminal 4.

The input tuning circuit 2 is connected to an RF amplifier 7 via a series circuit formed by a coupling varactor diode 5 and a coupling capacitor 6. An anode of the coupling varactor diode 5 is connected to the anode of the first varactor diode 2d. A cathode of the coupling varactor diode 5 is connected to the tuning voltage terminal 4.

An interstage tuning circuit 8 is connected to the output of the RF amplifier 7. The interstage tuning circuit 8 is also a tuning circuit that does not carry out band switching. A primary circuit includes a first varactor diode 8a, an inductance element 8b connected to an anode of the first varactor diode 8a, and a capacitor 8c which connects a cathode of the first varactor diode 8a to ground. Similarly, a secondary circuit includes a first varactor diode 8d, an inductance element 8e connected to an anode of the first varactor diode 8d, and a capacitor 8f which connects a cathode of the first varactor diode 8d to ground. The inductance element 8b is connected in series to the inductance element 8e. A connection point between the inductance elements 8b and 8e is connected to one end of a coupling inductance element 8g. The other end of the inductance element 8g is connected to ground by a capacitor 8h. The cathodes of the two first varactor diodes 8a and 8d are connected to the tuning voltage terminal 4. A connection point between the coupling inductance element 8g and the capacitor 8h is connected to ground by a second resistor 9.

The interstage tuning circuit 8 is connected to a mixer 12 via a series circuit formed by a coupling varactor diode 10 and a capacitor 11. An anode of the coupling varactor diode 10 is connected to the anode of the first varactor diode 8d. A cathode of the coupling varactor diode 10 is connected to the tuning voltage terminal 4. Local oscillating signals are supplied from an oscillator 13 to the mixer 12. A television signal output from the interstage tuning circuit 8 is converted to an intermediate frequency signal by the mixer 12.

The oscillator 13 includes an oscillating transistor (not shown) and a resonant circuit 14 coupled to the oscillating transistor. The resonant circuit 14 includes a second varactor diode 14a, a capacitor 14b which connects a cathode of the second varactor diode 14a to ground, an inductance element 14c one end of which is connected to an anode of the second varactor diode 14a, and a capacitor 14d which connects the other end of the inductance element 14c to ground. The cathode of the second varactor diode 14a is connected to the tuning voltage terminal 4. A connection point between the inductance element 14c and the capacitor 14d is connected to ground via a second resistor 15.

A voltage of the anode of the first varactor diode 2d in the input tuning circuit 2, voltages of the anodes of the two first varactor diodes 8a and 8d in the interstage tuning circuit 8, and a voltage of the anode of the second varactor diode 14a in the resonant circuit 14 are all switched by a transistor 16. An emitter of the transistor 16 is connected to ground. A predetermined voltage is applied to a collector of the transistor 16, via a protection resistor 18, from a voltage stabilization circuit 17 which stabilizes a power supply voltage B. A switching voltage is applied to a base of the transistor 16 to turn on and off the predetermined voltage.

The connection point between the inductance element 2a and the capacitor 2c in the input tuning circuit 2 is connected to the collector of the transistor 16 via a first resistor 19. The connection point between the coupling inductance element 8g and the capacitor 8h in the interstage tuning circuit 8 is also connected to the collector of the transistor 16 via a first resistor 20. Furthermore, the connection point between the inductance element 14c and the capacitor 14d in the resonant circuit 14 is also connected to the collector of the transistor 16 via a first resistor 21.

The oscillating frequency of the oscillator 13 is controlled by a PLL circuit 25 based on channel selection data D. As a result, a tuning voltage Vt is output from the PLL circuit 25 to the tuning voltage terminal 4. The maximum value of the tuning voltage is about 30 volts. The minimum value of the tuning voltage is about 0.2 volts, although it varies depending on the internal configuration of the PLL circuit. It should be noted that the tuning voltage of nearly the minimum value becomes unstable.

Figure 2:
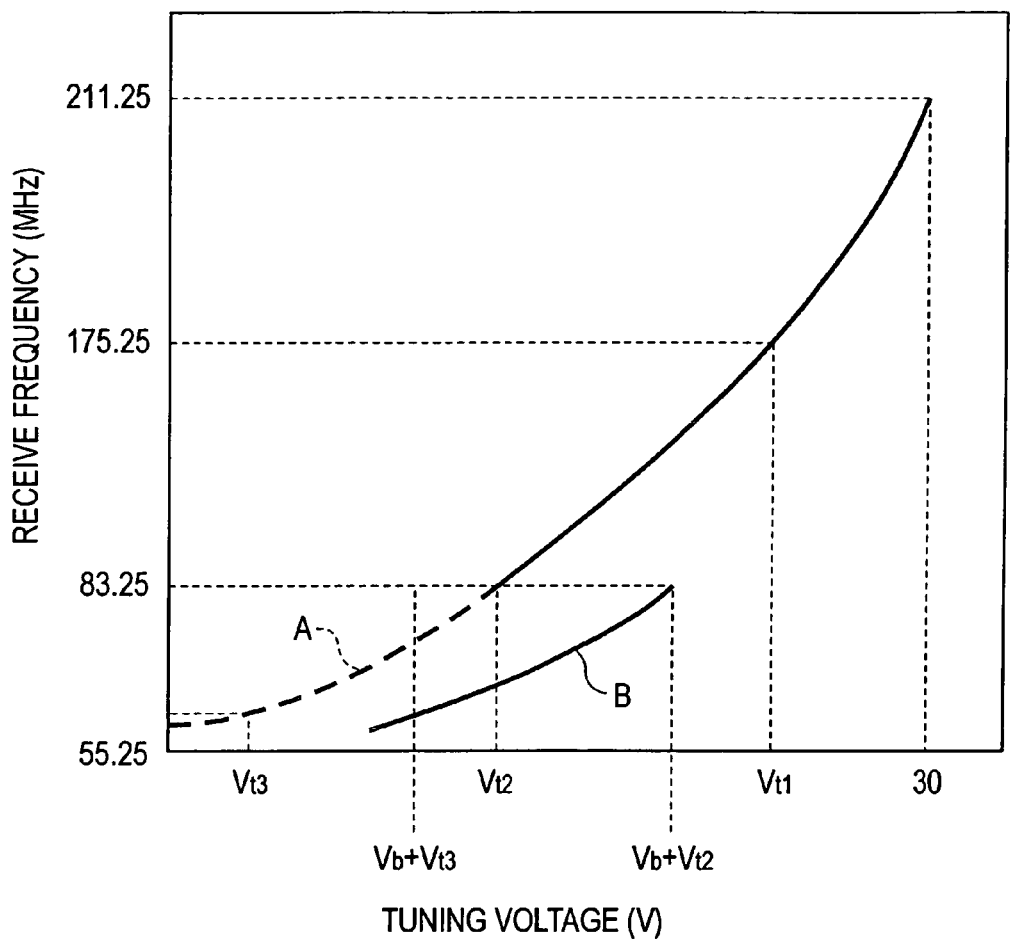
FIG. 2 is a receive frequency curve sheet of a television tuner according to the embodiment.

The operation of the above-described configuration will be described next with reference to FIGS. 1 and 2. When receiving a high-band television signal, the transistor 16 is turned on. Accordingly, the anodes of the varactor diodes 2d, 8a, 8d, and 14a have the ground potential. In this state, as shown in FIG. 2, when the maximum high-band frequency of 211.25 MHz is set to be received at the tuning voltage Vt of 30 volts, the minimum high-band frequency of 175.25 MHz can be received if the tuning voltage is decreased to a voltage Vt1. In general, this voltage value Vt1 is sufficiently high compared to the minimum value of the tuning voltage (0.2 volts). Consequently, the stability of the voltage can be maintained.

If the tuning voltage is continuously decreased in order to receive a low-band television signal, the stability of the tuning voltage decreases. In this embodiment, when a low-band television signal is received, the transistor 16 is turned off. Then, a voltage divided by the first resistor 19 and the second resistor 3 is applied to the anode of the first varactor diode 2d. A voltage divided by the first resistor 20 and the second resistor 9 is applied to the anodes of the first varactor diodes 8a and 8d. Additionally, a voltage divided by the first resistor 21 and the second resistor 15 is applied to the anode of the second varactor diode 14a.

If a voltage across the anode and the cathode of each varactor diode required for receiving the low-band television signal (83.25 MHz to 55.25 MHz) is low, that is, between Vt2 and Vt3, as shown by the dotted curve A in FIG. 2, and if the divided voltage is Vb, the range of the tuning voltage can be increased to the range of Vb+Vt2 and Vb+Vt3, as shown by the solid curve B. As a result, the range of received frequencies can be expanded without using an unstable, low tuning voltage.

By independently determining the resistance values of the first resistors 19, 20, and 21 and the second resistors 3, 9, and 15, the tracking shift between a tuning frequency and an oscillating frequency in a low band can be corrected.

Figure 3:
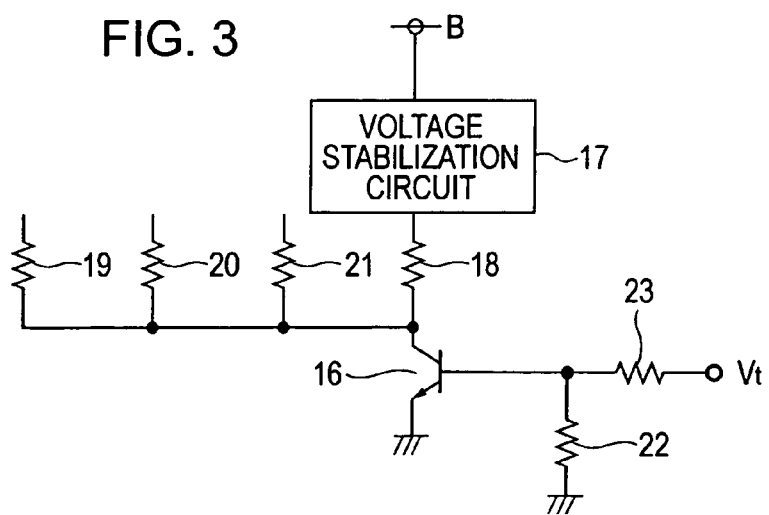
FIG. 3 is a circuit diagram of a television tuner according to an embodiment of the present invention, in which a voltage switching transistor is used in a different way.
Figure 4:
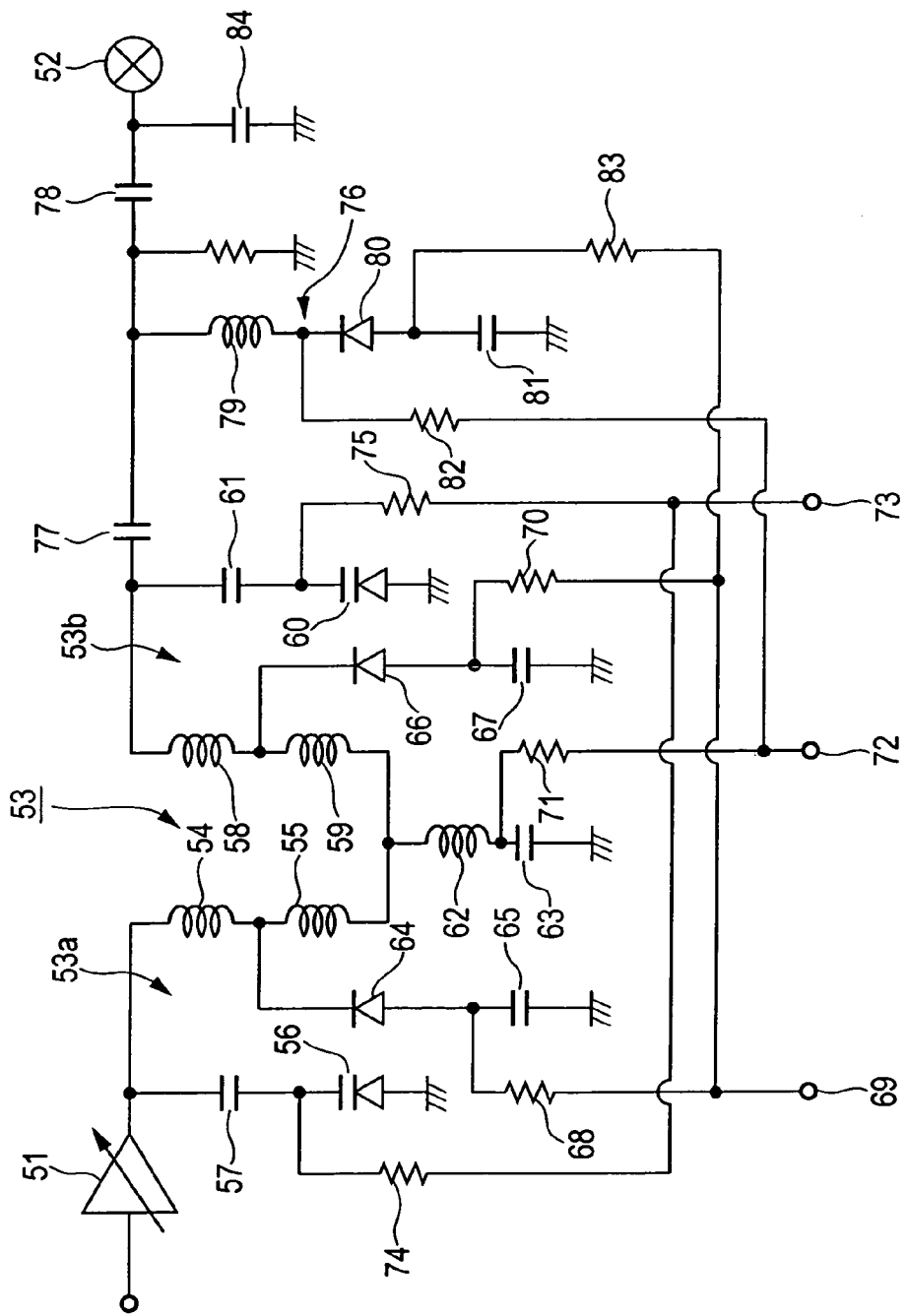
FIG. 4 is a circuit diagram of a known television tuner.

Additionally, as shown in FIG. 3, by connecting a base of the transistor 16 to ground via a resistor 22, applying the tuning voltage Vt to the base via a resistor 23, and appropriately determining the resistance values of the resistors 22 and 23, the transistor can automatically be turned on at a tuning voltage of more than or equal to Vt1 and can be turned off at tuning voltage of less than Vt1.

What is claimed is:

1. A television tuner comprising:
   a tuning circuit for tuning a television signal, the tuning circuit comprising a first varactor diode for changing a tuning frequency;
   a mixer for converting a television signal output from the tuning circuit to an intermediate frequency signal;
   an oscillator for supplying a local oscillating signal to the mixer, the oscillator comprising a second varactor diode for changing an oscillating frequency; and
   a PLL circuit for outputting a tuning voltage for tuning the television signal;
   wherein the tuning voltage is applied to cathodes of the first varactor diode and the second varactor diode and wherein voltages of anodes of the first varactor diode and the second varactor diode are higher at a time of receiving the television signal whose frequency is lower than or equal to a predetermined frequency than at a time of receiving a television signal whose frequency is higher than the predetermined frequency;
   a transistor for switching voltages of the anodes of the first varactor diode and the second varactor diode;
   wherein a collector of the transistor is pulled up to a predetermined voltage, an emitter of the transistor is connected to ground, the anodes of the first varactor diode and the second varactor diode are connected to the collector of the transistor by the corresponding first resistors, the anodes of the first varactor diode and the second varactor diode are also connected to ground for a direct current by the corresponding second resistors, the transistor is turned on when receiving the television signal whose frequency is higher than the predetermined frequency, and the transistor is turned off when receiving the television signal whose frequency is lower than or equal to the predetermined frequency.

2. The television tuner according to claim 1, wherein the tuning voltage is applied to a base of the transistor.

3. The television tuner according to claim 1, wherein the predetermined voltage is a stabilized voltage.

* * * * *